(12) United States Patent
Bergsma

(10) Patent No.: US 11,095,286 B2
(45) Date of Patent: Aug. 17, 2021

(54) ELECTROSTATIC DISCHARGE CLAMP TOPOLOGY

(71) Applicant: SKYWORKS SOLUTIONS, INC., Irvine, CA (US)

(72) Inventor: Adrian John Bergsma, Kanata (CA)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 16/900,421

(22) Filed: Jun. 12, 2020

(65) Prior Publication Data

US 2020/0395935 A1   Dec. 17, 2020

Related U.S. Application Data

(60) Provisional application No. 62/860,531, filed on Jun. 12, 2019.

(51) Int. Cl.
| | | |
|---|---|---|
| H03K 5/08 | (2006.01) |
| H03K 5/13 | (2014.01) |
| H03K 17/04 | (2006.01) |
| H02H 9/00 | (2006.01) |
| H03K 17/687 | (2006.01) |
| H01L 27/02 | (2006.01) |
| H03H 1/02 | (2006.01) |
| H03K 17/74 | (2006.01) |

(52) U.S. Cl.
CPC ..... *H03K 17/6872* (2013.01); *H01L 27/0251* (2013.01); *H03H 1/02* (2013.01); *H03K 17/74* (2013.01)

(58) Field of Classification Search
None
See application file for complete search history.

(56) References Cited

U.S. PATENT DOCUMENTS

| | | | | |
|---|---|---|---|---|
| 6,510,033 B1 * | 1/2003 | Maloney | ............... | H03K 5/08 |
| | | | | 361/111 |
| 7,511,931 B2 * | 3/2009 | Fairgrieve | ........ | H03K 17/08142 |
| | | | | 361/111 |
| 8,582,260 B2 * | 11/2013 | Shimomura | ........... | H02H 9/046 |
| | | | | 361/56 |
| 2012/0236447 A1 * | 9/2012 | Mack | ..................... | H02H 9/046 |
| | | | | 361/56 |

* cited by examiner

*Primary Examiner* — Kenneth B Wells
(74) *Attorney, Agent, or Firm* — Chang & Hale LLP

(57) ABSTRACT

A clamping circuit comprises a first field-effect transistor (FET) having a gate, a source, and a drain, a diode, a first voltage source, and coupling circuitry configured to couple the first voltage source to the drain of the first FET and the diode to the source of the first FET.

20 Claims, 6 Drawing Sheets

ELECTROSTATIC DISCHARGE CLAMP TOPOLOGY

CROSS-REFERENCE TO RELATED APPLICATION

This application claims priority to U.S. Provisional Application No. 62/860,531 filed Jun. 12, 2019, entitled ELECTROSTATIC DISCHARGE CLAMP TOPOLOGY, the disclosure of which is hereby expressly incorporated by reference herein in its respective entirety.

BACKGROUND

The present disclosure relates to field-effect transistors (FETs), related devices, and related methods.

Electrostatic discharge (ESD) clamps that use large n-type FETs (nFETs) have parasitic leakage current that are temperature and voltage dependent. In some cases, sleep current and/or low-power specifications can be very stringent.

SUMMARY

In accordance with some implementations, the present disclosure relates to a clamping circuit comprising a first field-effect transistor (FET) having a gate, a source, and a drain, a diode, a first voltage source, and coupling circuitry configured to couple the first voltage source to the drain of the first FET and the diode to the source of the first FET.

In some embodiments, the first voltage source is a positive voltage source. The clamping circuit may further comprise a second voltage source and the coupling circuitry may be further configured to couple the diode to the second voltage source. In some embodiments, the second voltage source is a negative voltage source. The clamping circuit may further comprise a ground node and the coupling circuitry may be further configured to couple the diode to the ground node.

The clamping circuit may further comprise an RC network including a resistor and a capacitor and the coupling circuitry may be further configured to couple the RC network to the first voltage source. In some embodiments, the coupling circuitry is further configured to couple the RC network and the diode to a common node. The coupling circuitry may be further configured to couple the node to a second voltage source.

In some embodiments, the clamping circuit further comprises an inverter and the coupling circuitry may be further configured to couple the inverter to the first voltage source. The inverter may include a second FET. In some embodiments, the coupling circuitry is further configured to couple the inverter and the diode to a node. The coupling circuitry may be further configured to couple the node to a second voltage source. In some embodiments, the coupling circuitry is further configured to couple the inverter to the gate of the first FET.

The clamping circuit may further comprise a resistor and the coupling circuitry may be further configured to couple the resistor to the gate of the first FET and in parallel with the diode. In some embodiments, the coupling circuitry is further configured to couple the resistor to a second voltage source.

In some implementations, the present disclosure relates to a circuit comprising a first voltage source, a first diode network including one or more series-connected diodes, a second diode network including one or more series-connected diodes, a field-effect transistor (FET), a second voltage source, and coupling circuitry configured to couple: the first diode network between the first voltage source and the second diode network, the FET in parallel with the second diode network, and the second diode network to the second voltage source.

In some embodiments, the circuit further comprises an inverter, a resistor, and a capacitor, and the coupling circuitry is further configured to couple an output of the inverter to a gate of the FET and the resistor, the capacitor, and an input of the inverter to a common node. The coupling circuitry may be further configured to couple the inverter, the resistor, and the capacitor in parallel with the second diode network. In some embodiments, the coupling circuitry is further configured to couple the inverter and the resistor to the first voltage source and the inverter and the capacitor to the second voltage source. The circuit may further comprise a third diode network including one or more series-connected diodes and the coupling circuitry may be further configured to couple the third diode network between the second diode network and the second voltage source.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 2B illustrates a second circuit in which a second FET is added across the gate resistor of the first FET in accordance with one or more embodiments.

DESCRIPTION

The headings provided herein, if any, are for convenience only and do not necessarily affect the scope or meaning of the claimed invention.

In radio-frequency (RF) applications, power amplifier supply pins are highly likely subjected to both component-level human body model (HBM) and system-level electrostatic discharge (ESD) and/or electrical overstress (EOS) surge requirements. Some methods of protecting circuits from high supply voltages involve restricting the allowed supply voltage and/or adding one or more diodes between the supply voltage and the clamp field-effect transistor (FET).

It is noted that in many applications, ESD and EOS surge protection standards are handled or managed differently between integrated circuit designers and module component designers. Typically, integrated circuit designers plan out an on-chip level ESD protection scheme for HBM, machine model (MM), and charge device model (CDM) qualifications, whereas the EOS surge and International Electrotechnical Commission (IEC) protections are managed through board-level designs.

ESD clamps that use large FETs may experience parasitic leakage currents that may be temperature- and/or voltage-dependent. This may be an issue particularly for sleep current and/or low-power specifications that may be very stringent.

Figure 1A:
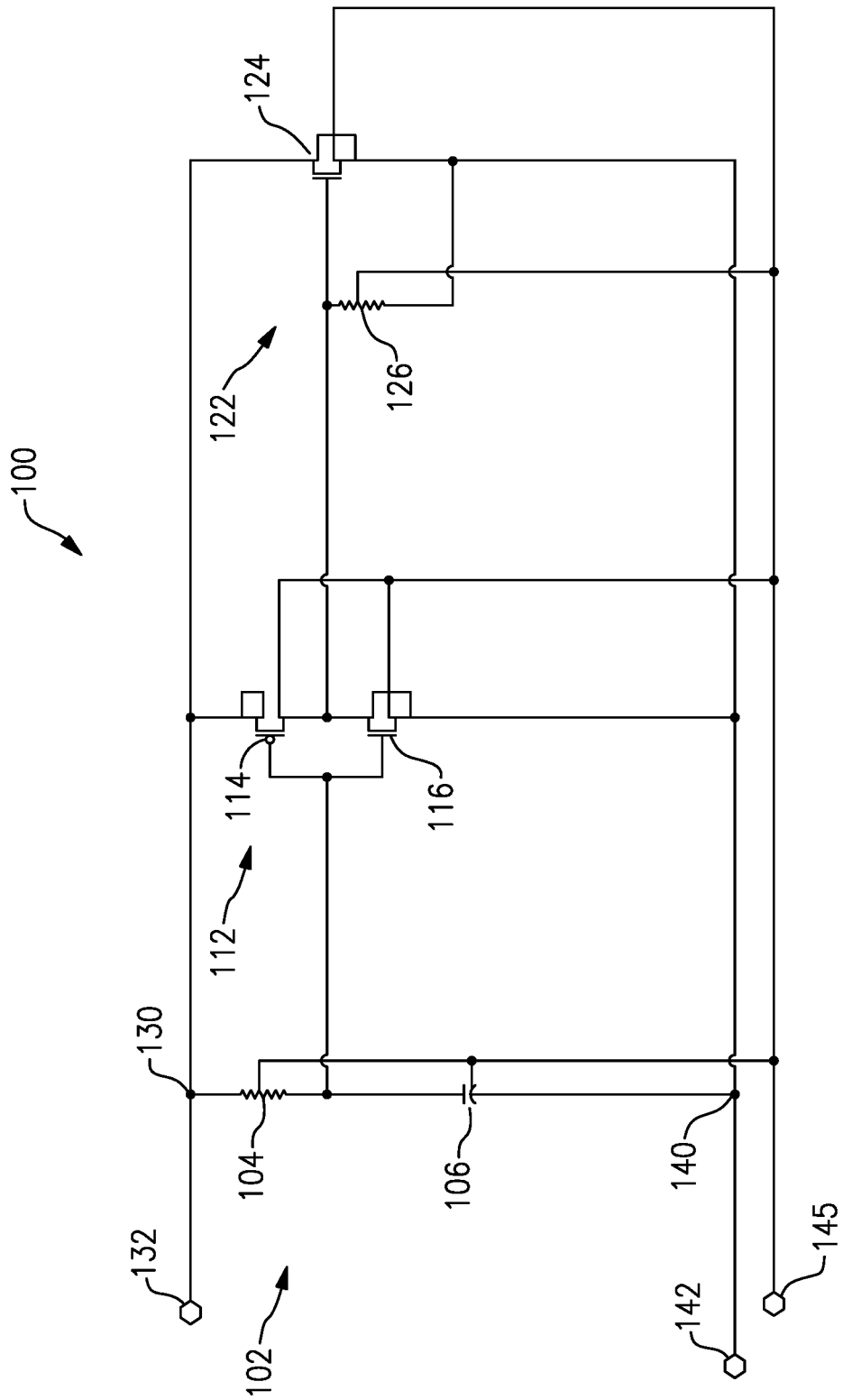
FIG. 1A provides a first circuit having an RC network, an inverter, and a switch in accordance with one or more embodiments.

FIG. 1A provides a first circuit having an RC network 102, an inverter 112, and a switch 122. The RC network 102, inverter 112, and switch 122 may be in a parallel configuration with respect to each other. The RC network 102 includes a first resistor 104 and a capacitor 106. The RC network 102 may generate an RC time constant. The inverter 112 includes a first FET 114 and a second FET 116. The switch 122 includes a third FET 124 and a second resistor 126. The second resistor 126 may be coupled to the gate and source (or drain) of the third FET 124. Each of the RC network 102, inverter 112, and switch 122 may be coupled at a first node 130 to a first voltage source 132 (e.g., a positive supply voltage (VDD)) and/or at a second node 140 to a second voltage source 142 (e.g., a negative supply voltage (VSS)) and/or to ground. Due at least in part to the presence of the RC network 102, in steady state (i.e., during normal operation) the input at the inverter 112 may be equal to 1 V and/or VDD. Accordingly, at steady state, the output of the inverter 112 may be equal to 0 and/or VSS, and the third FET 124 may be in an OFF state. The second resistor 126 may be configured to ensure that when the third FET 124 is in the OFF state, any leakage current at the third FET 124 is reduced as much as possible. In cases when there is no power at the first circuit 100 and/or if the first circuit 100 is powered up and the first circuit 100 experiences a voltage spike through the first voltage source 132, the inverter 112 may be configured to switch state, and the capacitor 106 may be configured to maintain the voltage at a relatively low value. If the first voltage source 132 and the second voltage source 142 are at approximately 0 V and the first circuit 100 experiences rapid ESD spike at the first voltage source 132, the capacitor 106 may be configured to hold the inverter 112 to 0 V and/or cause the output of the inverter to be approximately 1 V; the capacitor 106 may also be configured to turn on the third FET 124. In this way, current may be redirected through the third FET 124 and effect of voltage spikes may be reduced at the third FET 124.

In some cases, the third FET 124 may experience leakage current. For example, when the third FET 124 is powered up in normal operation, a drain-to-source leakage current may exist through the third FET 124. Leakage current may be dependent on the voltage across the drain and source of the third FET 124 and/or on temperature. If the amount of leakage current exceeds an allowable leakage current value specified for a given circuit, the circuit may experience issues.

Figure 1B:
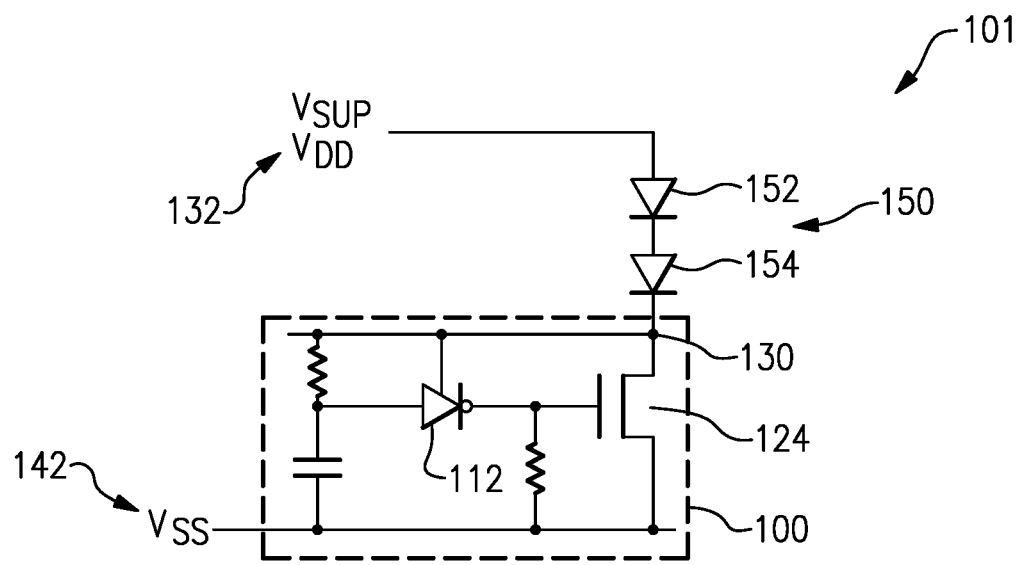
FIG. 1B illustrates a circuit having a diode network situated between the voltage source and a first node in accordance with one or more embodiments.
Figure 1C:
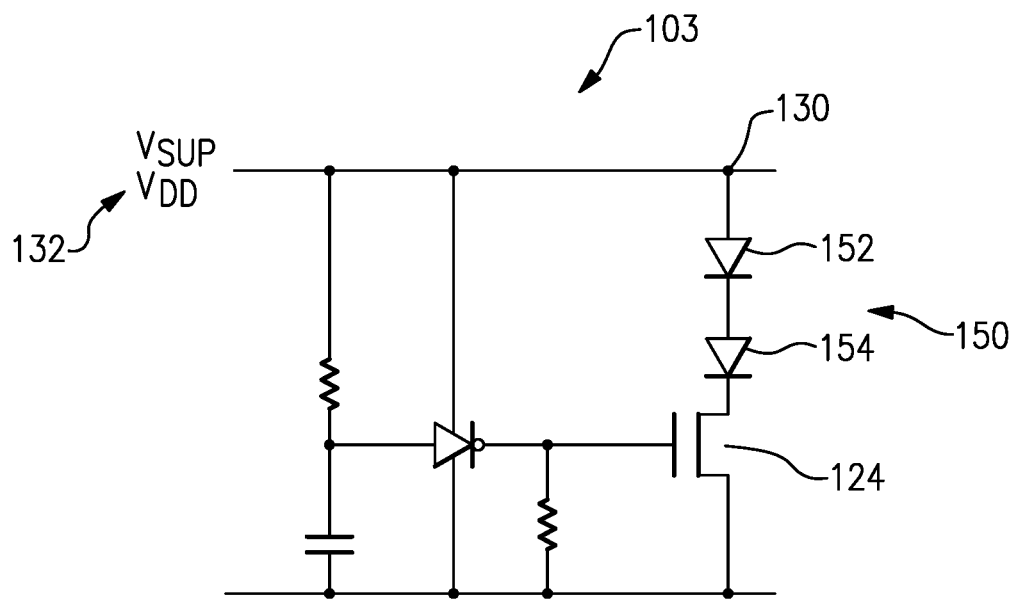
FIG. 1C illustrates a circuit having a diode network situated between the first node and the third FET in accordance with one or more embodiments.

If the voltage across the third FET 124 is too large (e.g., above a voltage level specified for the third FET 124 and/or the first circuit 100), one solution may involve decreasing the voltage level. One method for decreasing the voltage at a circuit may involve including one or more diodes between the first voltage source 132 and the FET 124. FIG. 1B provides a first modified circuit 101 including additions to the first circuit 100. FIG. 1C provides a second modified circuit 103. Each of the first modified circuit 101 and the second modified circuit 103 includes a diode stack/network 150 having one or more diodes. In FIG. 1B, a diode network 150 may be situated between the voltage source 132 and the first node 130 while in FIG. 1C, the diode network 150 may be situated between the first node 130 and the third FET 124. Coupling circuitry may be used to couple the various components. The diode network 150 may include a first diode 152 and/or a second diode 154. While the diode network 150 is shown comprising two diodes, the diode network 150 may alternatively comprise a single diode or more than two diodes. Each of the first diode 152 and the second diode 154 may have a voltage of approximately 0.7 V (e.g., 1 base-to-emitter voltage (Vbe)). Usage of the diode network 150 may allow for maintaining leakage current even with increasing supply voltage and/or lowering leakage current for a given supply voltage. One issue that may be associated with a diode network 150 is that the electrical safety testing (EST) strike (i.e., surge) voltage may be allowed to be approximately two 2 Vbe (i.e., approximately 1.4 V) higher than the original strike voltage. Thus, the strike voltage may be essentially equivalent to the voltage across a FET. The strike voltage may be able to grow to the original strike voltage plus two Vbe, which may increase risk of damage to the device. Such risk may be reduced by adding additional clamps; however, the addition of clamps may increase leakage current.

By situating the diode network 150 between the first node 130 and the third FET 124, as shown in FIG. 1C, a relatively lower strike level voltage turn-on may be achieved to allow a relatively faster response time. However, the inverter 112 may be required to tolerate the strike voltage and/or the supply voltage from the first voltage source 132.

Each of the RC network 102, inverter 112, and switch 122 may be coupled at a first node 130 to the first voltage source 132 (e.g., a positive supply voltage (VDD)) and/or at a second node 140 to a second voltage source 142 (e.g., a negative supply voltage (VSS)) and/or to ground.

In some embodiments, one or more components of any of the circuits 100, 101, 103 may connect to a substrate 145. A substrate 145 may be an integrated circuit wafer holding additional circuitry. The inclusion of a substrate 145 may be optional and/or may be process-dependent.

Figure 2:
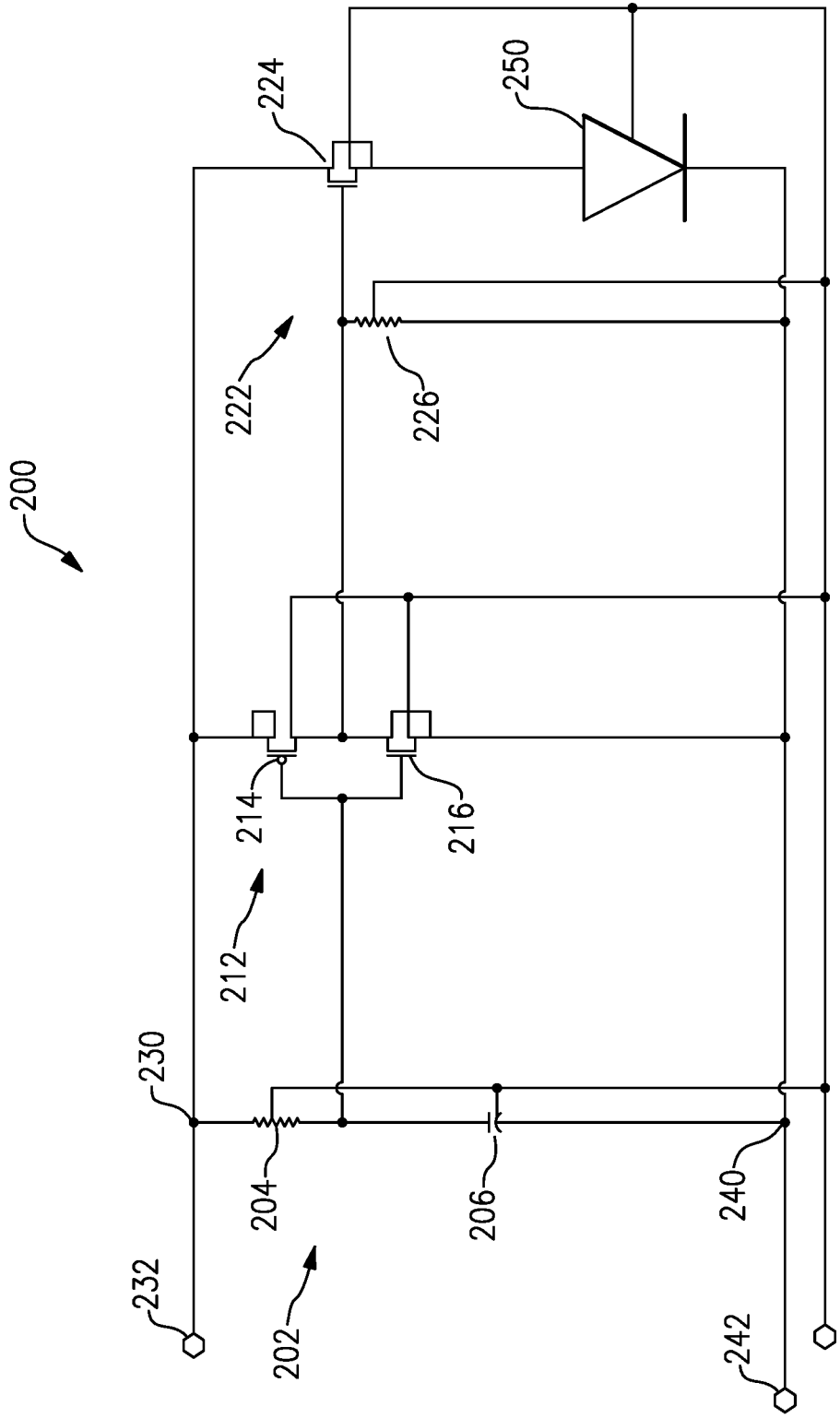
FIG. 2 illustrates a circuit in which a diode of a sufficient size is placed between a third FET and a second node via coupling circuitry in accordance with one or more embodiments.

FIG. 2 provides an improved circuit 200 in which a diode 250 of a sufficient size (e.g., large enough to accept/support the current of the ESD strike voltage without being destroyed/damaged) is placed between the third FET 224 and the second node 240 (e.g., a ground node) via coupling circuitry. The circuit 200 may include an RC network 202, an inverter 212, and a switch 222. The RC network 202, inverter 212, and switch 222 may be in a parallel configuration with respect to each other. The RC network 202 may include a first resistor 204 and a capacitor 206. The RC network 202 may generate an RC time constant. The inverter 212 may include a first FET 214 and a second FET 216. The switch 222 may include a third FET 224 and a second resistor 226. The second resistor 226 may be coupled to the gate and source (or drain) of the third FET 224. Each of the RC network 202, inverter 212, and switch 222 may be coupled at a first node 230 to a first voltage source 232 (e.g., a positive supply voltage (VDD)) and/or at a second node 240 to a second voltage source 242 (e.g., a negative supply voltage (VSS)) and/or a ground node.

Placement of the diode 250 between the third FET 224 and the second node 240 may advantageously reduce the leakage current by providing a DC feedback mechanism that may help maintain the gate-to-source voltage (Vgs) of the third FET 224 in the OFF state. In some embodiments, more than one diode may be included in the circuit 200 to allow for the design for any supply voltage.

In some embodiments, the circuit 200 may comprise a single diode 250, thereby advantageously reducing the number of components in series with the third FET 224 and maintaining and/or improving ESD compliance with minimal added components. Moreover, the circuit 200 may have a relatively faster turn-on time for improved protection of the third FET 224 and/or other components of the circuit 200.

In some embodiments, the diode 250 may cause and/or experience a leakage current. Though diodes are considered to be in an OFF state, when there is a voltage across a diode, the diode may leak current to some extent. In some cases, leakage current through a diode may be minimized and/or reduced by applying 0 V (or as little voltage as possible) across the diode.

Placement of the diode 250 between the third FET 224 and the second node 240 may advantageously create negative feedback to reduce leakage current. When the third FET 224 leaks current, the current may enter the diode 250. In response to the leaked current, the diode 250 may turn on and increase the voltage across the diode 250. By increasing the voltage, feedback may be generated to turn off voltage at the third FET 224 and/or reduce (or prevent altogether) leakage through the third FET 224. The negative feedback from the diode 250 may advantageously operate to turn-off the third FET 224. In other words, leakage current from the third FET 224 may be utilized to reduce leakage current through the third FET 224. The gate voltage of the third FET 224 may be held constant and the source voltage of the third FET 224 may rise. Any leakage current from the third FET 224 may enter the diode, and the voltage across the diode 250 may increase. If the voltage across the diode 250 is increasing, the gate-to-source voltage of the third FET 224 may be reduced and the third FET 224 may be turned off. The diode 250 may be sized to correspond to the size of the third FET 224, the amount of current of the circuit 200, and/or the strike voltage of the circuit 200.

The circuit 200 and/or various other circuits described herein may comprise coupling circuitry configured to couple different components of the circuits. The various lines drawn in FIG. 2 and/or in other figures may represent coupling circuitry between the various components. For example, coupling circuitry may be configured to couple the first voltage source 232 to the source and/or drain of the third FET 224. Moreover, coupling circuitry may be configured to couple the source and/or drain of the third FET 224 to the diode 250. In this way, leakage current may be transferred between the third FET 224 and the diode 250.

The circuit of FIG. 2 may be configured to support a similar or identical supply voltage to that of the circuits 100, 101, 103 in FIGS. 1A, 1B, and/or 1C. When VDD rises quickly, the capacitor 206 can suppress and/or slow down gate voltage changes at the inverter 212, however the supply voltage of the inverter 212 may rise rapidly. The output of the inverter 212 may be configured to approximate the strike voltage and/or may be configured to turn on the third FET 224. For the inverter 212 to turn on the third FET, the strike voltage may need to rise a full Vbe (e.g., 0.7 V) before it is recognized. For example, the third FET 224 may not turn on until the strike voltage increases by one Vbe.

In the circuits 100, 101, 103 of FIGS. 1A-1C, the strike voltage may be equivalent to Vgs of the third FET 124, 224 while in the circuit 200 of FIG. 2, the strike voltage may be Vgs plus one Vbe. With respect to timing, the strike voltage may occur later in the circuit of FIG. 2 than in the circuits 100, 101, 103 of FIGS. 1A-1C. When the third FET 224 turns on, the diode 250 may also be turned on. The protection against voltage strikes of the second circuit 200 may be approximately equivalent to the protection of the circuits 100, 101, 103, particularly where the diode network 150 of FIG. 1B and/or FIG. 1C includes a single diode. The placement of the diode 250 may be selected as needed and may provide different results for different placements within the second circuit 200. The second circuit 200 may advantageously provide identical or similar strike capabilities and/or clamping voltage to that of the circuits 100, 101, 103.

In clamping circuits including inverters, there may frequently be issues associated with an inverter. For example, inverters may be directly sensitive to the strike voltage of the circuit because a circuit may typically not include any protections for the inverter. Thus, if a clamp FET is not designed to clamp quickly (e.g., it is not configured to respond quickly to protect the inverter), it may be required to ensure that the strike voltage the inverter experiences is low enough not to damage the inverter. In some cases, multiple diodes may be stacked to handle very high supply voltages. However, certain issues may be associated with stacking several diodes, including an increased device size.

FIGS. 3A-3D provide a third circuit 300 including one or more diode stacks/networks including one or more series-connected diodes. The circuit may include a first diode stack 350, a second diode stack 360, and/or a third diode stack 370. In the examples shown in FIGS. 3A-3D, the first diode stack 350 includes a first diode 352 and a second diode 354, the second diode stack 360 includes a third diode 362 and a fourth diode 364, and the third diode stack 370 includes a fifth diode. However, each of the diode stacks may include any number of diodes. During normal processes, at least the first diode stack 350 and third diode stack 370 may be in an OFF state and/or may be configured to receive leakage current associated with the circuit 300. The circuit 300 may include an FET 324 in parallel with the second diode stack 360. For example, the source or drain of the FET 324 may be coupled to a first node 358 and/or the source or drain of the FET 324 may be coupled to a second node 368. The first node 358 may further be coupled to the first diode stack 350 (e.g., at the cathode of the second diode 354) and/or the second diode stack 360 (e.g., at the anode of the third diode 362). The second node 368 may further be coupled to the second diode stack 360 (e.g., at the cathode of the fourth diode 364) and/or the third diode stack 370 (e.g., at the anode of the fifth diode). Because the third diode stack 370 may be coupled to the source or drain of the FET 324 via the second node 368, there may be reduced bypass leakage. If the circuit 300 experiences an ESD strike, the FET 324 may short out the second diode stack 360. In this way, the effective number of diodes across the source of the FET 324 may be changed, which may advantageously allow for tailoring the strike voltage at the circuit 300. In some embodiments, the drain and/or source of the FET 324 may couple between diodes of the first diode stack 350, second diode stack 360 and/or third diode stack 370. By changing where the source and/or drain of the FET 324 are coupled, the strike voltage of the circuit 300 can be changed relative to the standing voltage. In some embodiments, the circuit 300 may be configured to support ESD strike voltages of 2K V or more. The first diode stack 350 (e.g., the first diode 352) may be coupled (e.g., at the anode of the first diode 352) to a first voltage source 332 and/or the third diode stack 370 (e.g., the fifth diode) may be coupled (e.g., at the cathode of the fifth diode) to a second voltage source 342.

Figure 3A:
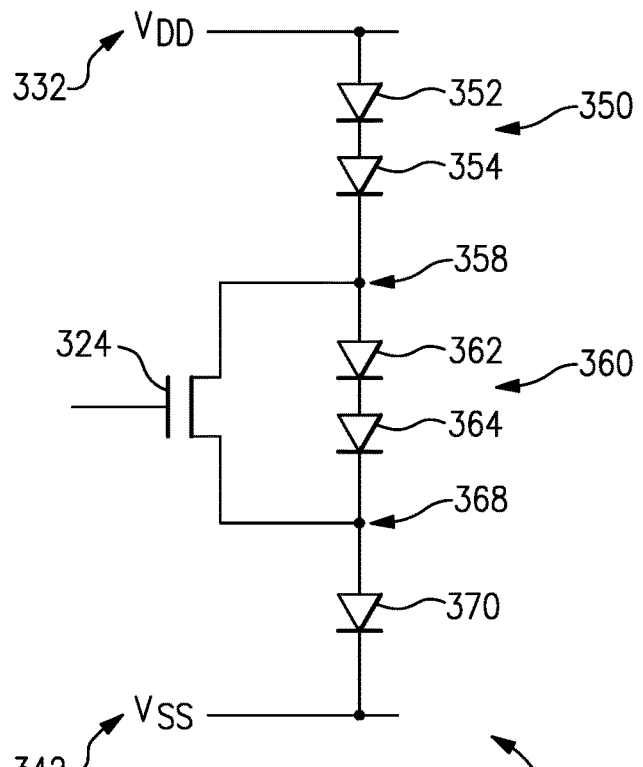
FIG. 3A provides a third circuit having one or more diode stacks/networks including one or more series-connected diodes in accordance with one or more embodiments.
Figure 3B:
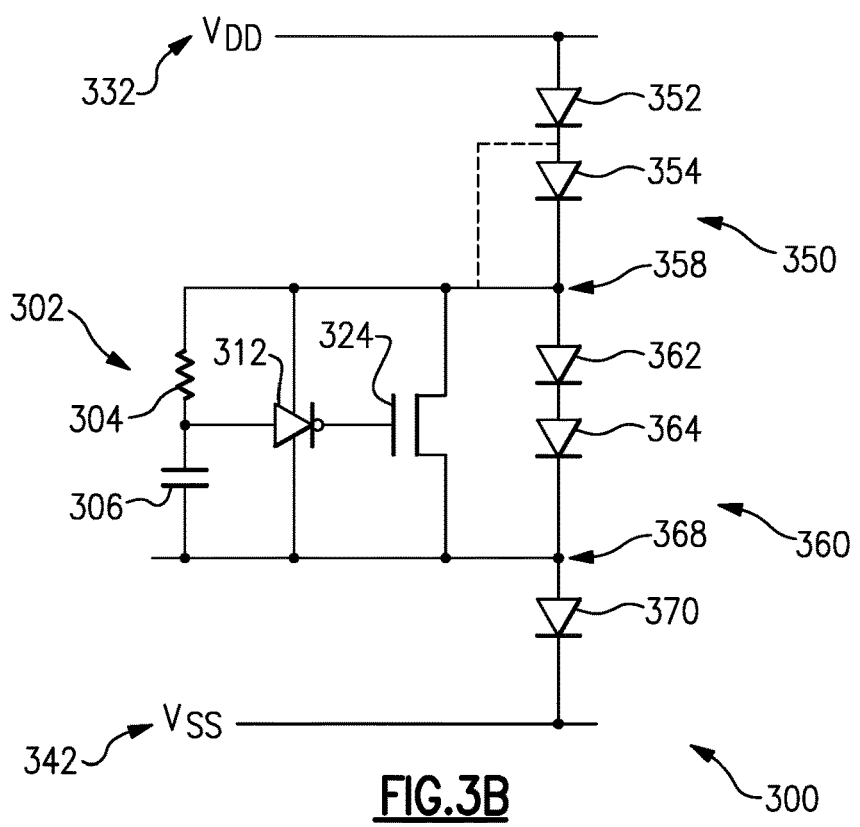
FIG. 3B provides a circuit including an RC network and/or an inverter in accordance with one or more embodiments.

As shown in FIG. 3B, the circuit 300 may include an RC network 302 and/or an inverter 312. In some embodiments, the inverter 312 may comprise a network of two gate-connected FETs (see, e.g., the inverter 212 of FIG. 2). The RC network 302, inverter 312, and FET 324 may be in a parallel configuration with respect to each other. For example, each of the RC network 302, inverter 312, and FET 324 may be coupled to the first node 358 and the second node 368. The RC network 302 may include a resistor 304 and a capacitor 306. In some embodiments, the inverter 312 may include one or more FETs. The FET 324 may be coupled in a parallel configuration to the second diode stack 260. Accordingly, the second diode stack 360 may be shunted. In some embodiments, the FET 324 may further be coupled to one or more resistors. The inverter 312 may be coupled to the gate of the FET 324. The inverter 312, resistor 304, and capacitor may each be coupled to a common node.

An output of the inverter 312 may be coupled to the gate of the FET 324. Similarly, an input of the inverter 312 may be coupled to the RC network 302 (e.g., to the resistor 304 and/or to the capacitor 306).

Figure 3C:
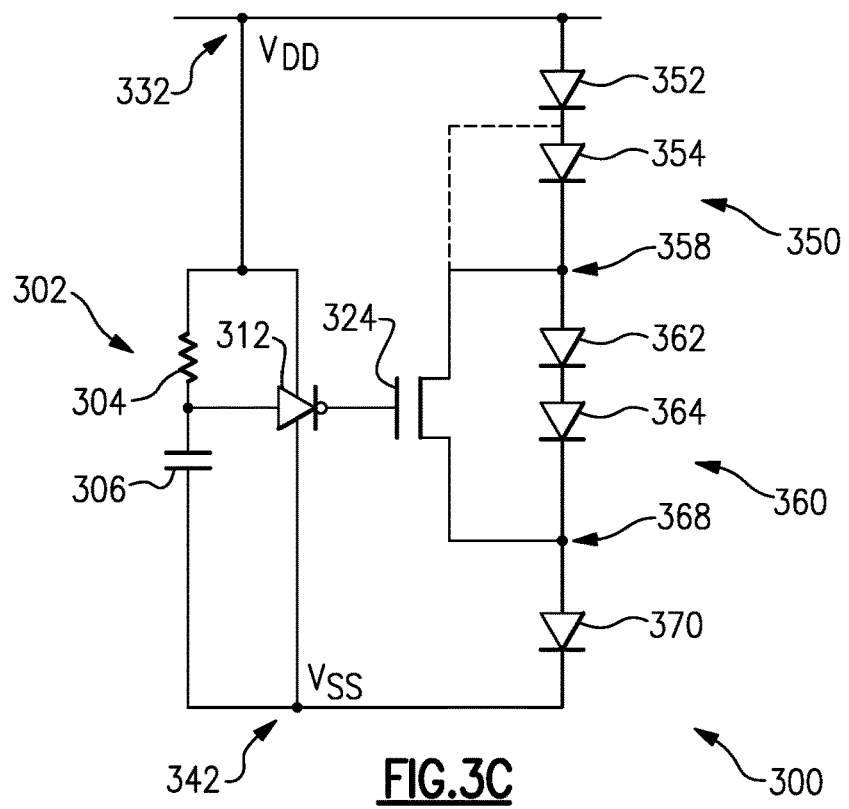
FIG. 3C provides a circuit including an RC network and inverter directly coupled to the first voltage source and/or the second voltage source in accordance with one or more embodiments.
Figure 3D:
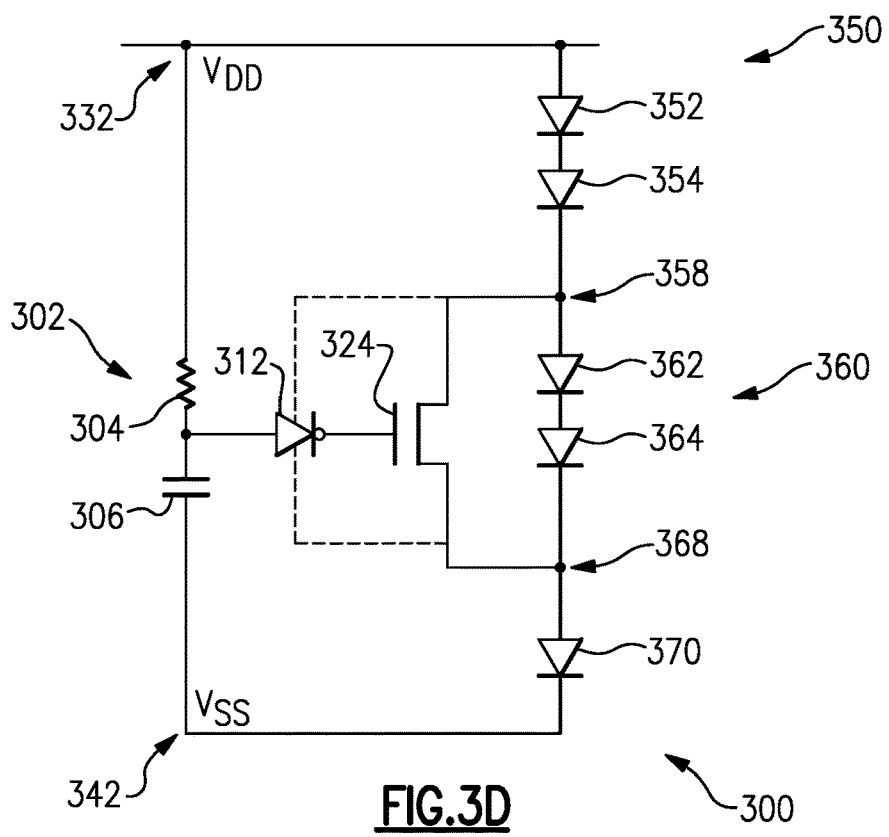
FIG. 3D provides a circuit including an RC network coupled directly to a first voltage source and/or a second voltage source and an inverter not coupled directly to the first voltage source or the second voltage source in accordance with one or more embodiments.

In FIG. 3C, the RC network 302 (e.g., the resistor 304) and inverter 312 may be directly coupled to the first voltage source 332 and/or the second voltage source 342 (e.g., the capacitor 306 may be coupled to the second voltage source 342). By connecting the RC network 302 and/or inverter 312 to the first voltage source 332, the inverter 312 may be more exposed to high voltages and may be susceptible to damage. In FIG. 3D, the RC network 302 (e.g., the resistor 304) may be coupled directly to the first voltage source 332 and/or the second voltage source 342 (e.g., the capacitor 306 may be coupled to the second voltage source 342) while the inverter 312 may not be coupled directly to the first voltage source 332 or the second voltage source 342.

To achieve ESD compliance, the effective impedance of a circuit from supply to ground through any diodes and/or clamps of the circuit may be monitored. For a given ESD standard, the FET may be required to carry a certain amount of current. Moreover, the greater the size of the device, the greater the amount the leakage current may be. In some cases, an FET clamp may be designed for a certain leakage, but may not pass ESD. Accordingly, more FET clamps may be added to the circuit to pass ESD. By reducing the current in the FET as in FIG. 2 and FIGS. 3A-3D described herein, a single FET (e.g., a relatively large FET) may be used rather than multiple FETs. The number of diodes may be reduced (e.g., in some cases, a single diode) as well while maintaining ESD compliance. The number of diodes may be selected depending on the strike voltage.

Figure 4:
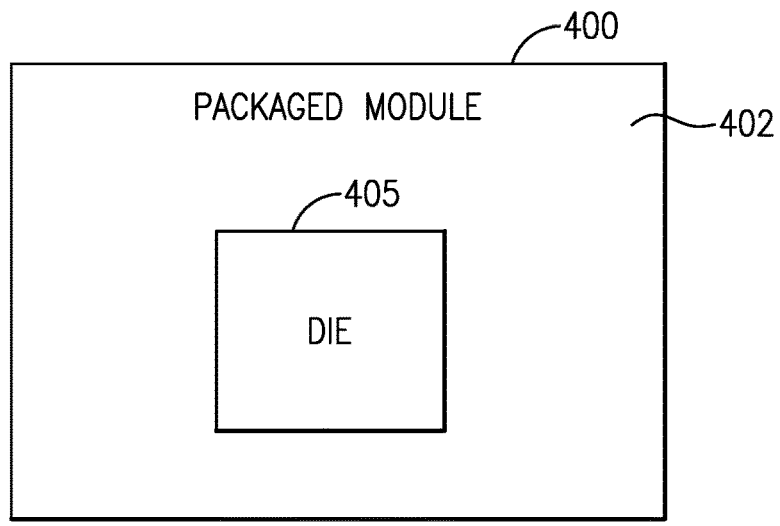
FIG. 4 shows a die implemented in a packaged module having one or more features as described herein.

FIG. 4 shows a die 405 implemented in a packaged module 400. Such a packaged module can include a packaging substrate 402 configured to receive a plurality of components.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 5:
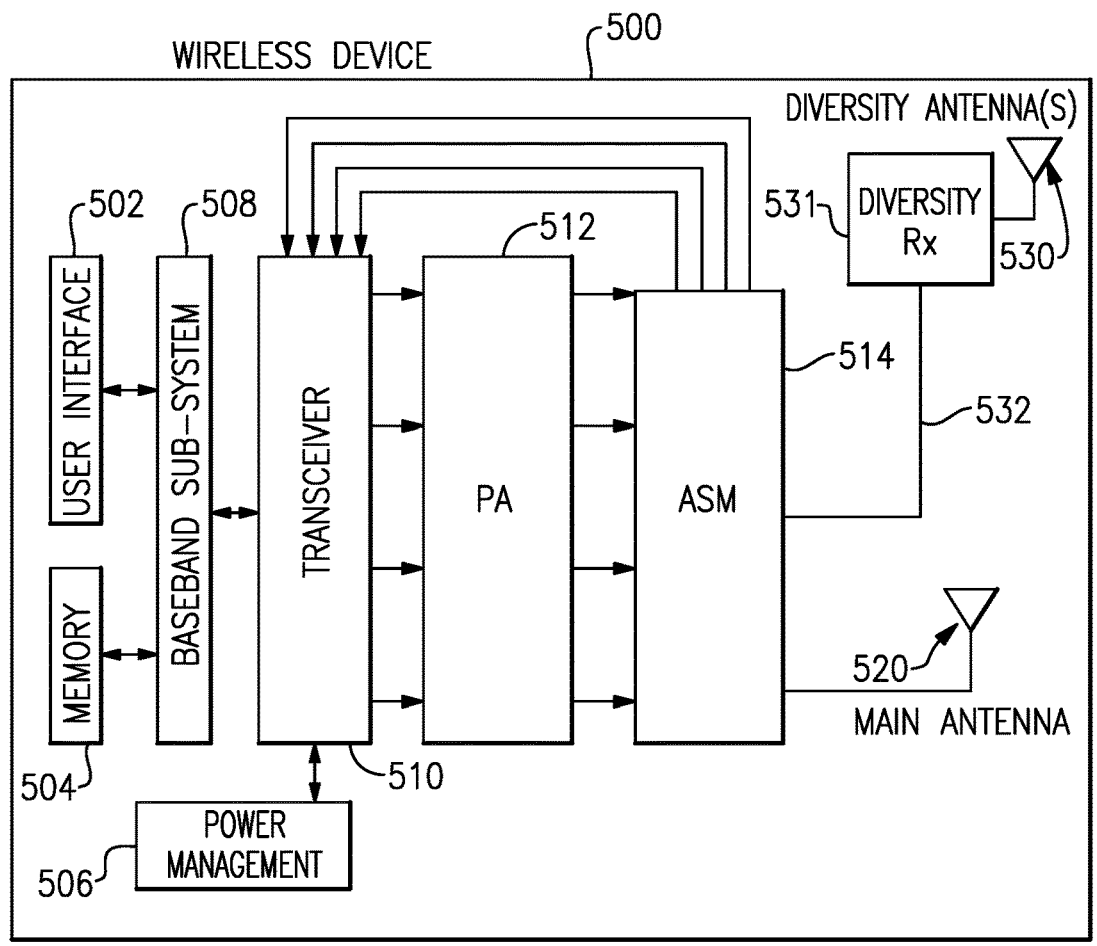
FIG. 5 depicts an example wireless device having one or more advantageous features described herein.

FIG. 5 depicts an example wireless device 500 having one or more advantageous features described herein. In some embodiments, a module 400 that includes one or more power amplifiers can also include one or more clamps having one or more features as described herein.

In the example of FIG. 5, power amplifiers (PAs) are depicted in a PA module 512; however, it will be understood that such power amplifiers can be implemented in one or more functional blocks, one or more devices such as die or modules, etc. Such power amplifiers can receive their respective RF signals from a transceiver 510 that can be configured and operated to generate RF signals to be amplified and transmitted, and to process received signals. The transceiver 510 is shown to interact with a baseband sub-system 508 that is configured to provide conversion between data and/or voice signals suitable for a user and RF signals suitable for the transceiver 510. The transceiver 510 is also shown to be connected to a power management component 506 that is configured to manage power for the operation of the wireless device 500. Such power management can also control operations of the baseband sub-system 508 and other components of the wireless device 500.

The baseband sub-system 508 is shown to be connected to a user interface 502 to facilitate various input and output of voice and/or data provided to and received from the user. The baseband sub-system 508 can also be connected to a memory 504 that is configured to store data and/or instructions to facilitate the operation of the wireless device, and/or to provide storage of information for the user.

In the example of FIG. 5, a diversity receive (DRx) module 531 can be implemented between one or more diversity antennas (e.g., diversity antenna 530) and the front-end module. Such a configuration can allow an RF signal received through the diversity antenna 530 to be processed (in some embodiments, including amplification by an LNA) with little or no loss of and/or little or no addition of noise to the RF signal from the diversity antenna 530. Such processed signal from the DRx module 540 can then be routed to the front-end module through one or more signal paths. In some embodiments, the wireless device 500 may or may not include the foregoing DRx functionality.

In the example of FIG. 5, a plurality of antennas (e.g., 520a, 520b) can be configured to, for example, facilitate transmission of RF signals from the PA module 512. In some embodiments, receive operations can also be achieved through some or all of the antennas 520a, 520b.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A circuit comprising:
    a first voltage source;
    a first diode network including one or more series-connected diodes;
    a second diode network including one or more series-connected diodes;
    a third diode network including one or more series-connected diodes;
    a field-effect transistor (FET);
    a second voltage source; and
    coupling circuitry configured to couple the first diode network between the first voltage source and the second diode network, the FET in parallel with the second diode network, and the third diode network between the second diode network and the second voltage source.

2. The circuit of claim 1 further comprising an inverter, a resistor, and a capacitor, wherein the coupling circuitry is further configured to couple an output of the inverter to a gate of the FET, and the resistor, the capacitor, and an input of the inverter to a node.

3. The circuit of claim 2 wherein the coupling circuitry is further configured to couple the inverter, the resistor, and the capacitor in parallel with the second diode network.

4. The circuit of claim 2 wherein the coupling circuitry is further configured to couple the inverter and the resistor to the first voltage source and the inverter and the capacitor to the second voltage source.

5. The circuit of claim 1 wherein the first voltage source is a positive voltage source.

6. The circuit of claim 1 wherein the second voltage source is a negative voltage source.

7. The circuit of claim 1 wherein the first diode network includes two series-connected diodes.

8. The circuit of claim 1 wherein the second diode network includes two series-connected diodes.

9. The circuit of claim 1 wherein the third diode network includes one diode.

10. A wireless device comprising:
    a first voltage source;
    a first diode network including one or more series-connected diodes;
    a second diode network including one or more series-connected diodes;
    a third diode network including one or more series-connected diodes;
    a field-effect transistor (FET);
    a second voltage source; and
    coupling circuitry configured to couple the first diode network between the first voltage source and the second diode network, the FET in parallel with the second diode network, and the third diode network between the second diode network and the second voltage source.

11. The wireless device of claim 10 further comprising an inverter, a resistor, and a capacitor, wherein the coupling circuitry is further configured to couple an output of the inverter to a gate of the FET, and the resistor, the capacitor, and an input of the inverter to a node.

12. The wireless device of claim 11 wherein the coupling circuitry is further configured to couple the inverter, the resistor, and the capacitor in parallel with the second diode network.

13. The wireless device of claim 11 wherein the coupling circuitry is further configured to couple the inverter and the resistor to the first voltage source and the inverter and the capacitor to the second voltage source.

14. The wireless device of claim 10 wherein the first voltage source is a positive voltage source.

15. The wireless device of claim 10 wherein the second voltage source is a negative voltage source.

16. The wireless device of claim 10 wherein the first diode network includes two series-connected diodes.

17. The wireless device of claim 10 wherein the second diode network includes two series-connected diodes.

18. The wireless device of claim 10 wherein the third diode network includes one diode.

19. A packaged module comprising:
    a first voltage source;
    a first diode network including one or more series-connected diodes;
    a second diode network including one or more series-connected diodes;
    a third diode network including one or more series-connected diodes;
    a field-effect transistor (FET);
    a second voltage source; and
    coupling circuitry configured to couple the first diode network between the first voltage source and the second diode network, the FET in parallel with the second diode network, and the third diode network between the second diode network and the second voltage source.

20. The packaged module of claim 19 further comprising an inverter, a resistor, and a capacitor, wherein the coupling circuitry is further configured to couple an output of the inverter to a gate of the FET, and the resistor, the capacitor, and an input of the inverter to a node.

* * * * *